United States Patent
Ishiguro

(10) Patent No.: US 11,387,099 B2
(45) Date of Patent: Jul. 12, 2022

(54) SPIN COATING PROCESS AND APPARATUS WITH ULTRASONIC VISCOSITY CONTROL

(71) Applicant: SANDISK TECHNOLOGIES LLC, Addison, TX (US)

(72) Inventor: Yutaka Ishiguro, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/951,291

(22) Filed: Nov. 18, 2020

(65) Prior Publication Data
US 2022/0157603 A1 May 19, 2022

(51) Int. Cl.
*H01L 21/02* (2006.01)
*H01L 21/463* (2006.01)
*H01L 21/449* (2006.01)

(52) U.S. Cl.
CPC .. *H01L 21/02282* (2013.01); *H01L 21/02255* (2013.01); *H01L 21/449* (2013.01); *H01L 21/463* (2013.01)

(58) Field of Classification Search
CPC ... H01L 21/607; H01L 21/449; H01L 21/463; H01L 21/02282; H01L 21/02255
See application file for complete search history.

(56) References Cited

U.S. PATENT DOCUMENTS

| | | |
|---|---|---|
| 2001/0003966 A1 | 6/2001 | Kitano et al. |
| 2002/0009863 A1 | 1/2002 | Zhang |
| 2004/0011285 A1 | 1/2004 | Tzeng et al. |
| 2006/0223336 A1* | 10/2006 | Wei .................. H01L 21/02282 438/782 |
| 2007/0121205 A1 | 5/2007 | Miles |
| 2012/0064349 A1* | 3/2012 | Sato ...................... B05D 1/005 428/411.1 |
| 2017/0138911 A1* | 5/2017 | Deng ................ H01L 21/67253 |
| 2018/0118562 A1 | 5/2018 | Drescher et al. |
| 2018/0185957 A1 | 7/2018 | Swoboda et al. |
| 2018/0337358 A1 | 11/2018 | Xie |
| 2019/0218131 A1 | 7/2019 | Swoboda et al. |
| 2019/0371612 A1 | 12/2019 | Xue et al. |

* cited by examiner

*Primary Examiner* — Dale E Page
*Assistant Examiner* — Quovaunda Jefferson
(74) *Attorney, Agent, or Firm* — The Marbury Law Group PLLC

(57) ABSTRACT

A spin coating method includes dispensing a coating material including a nonvolatile film material and a volatile solvent over a substrate, and spin coating the coating material over the substrate by spinning the substrate while applying ultrasound waves to the coating material to reduce a viscosity of the coating material during the spin coating.

13 Claims, 9 Drawing Sheets

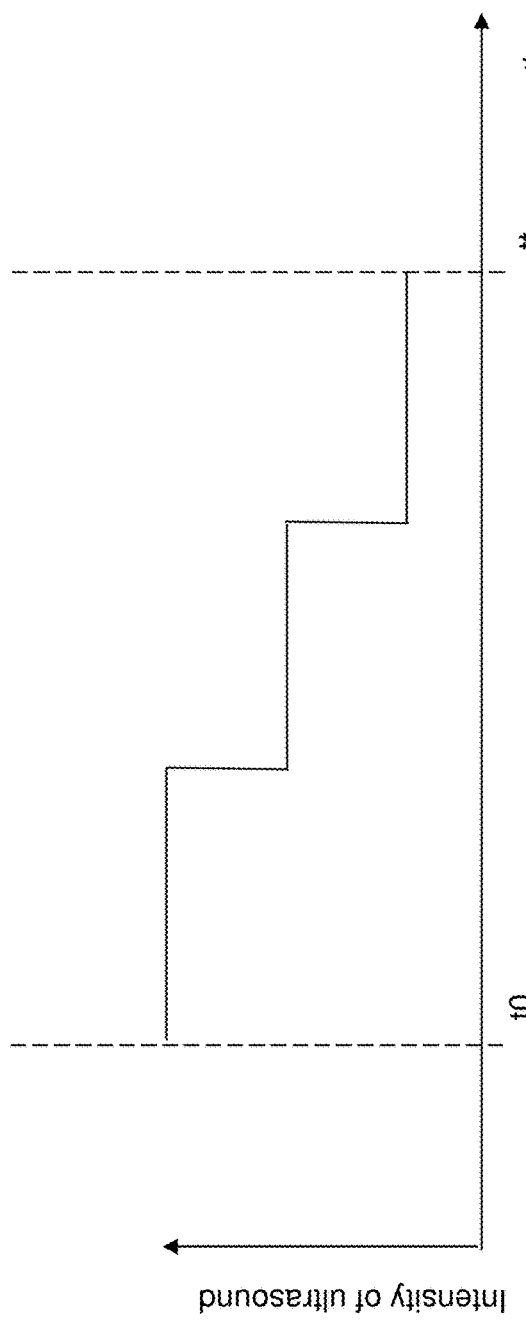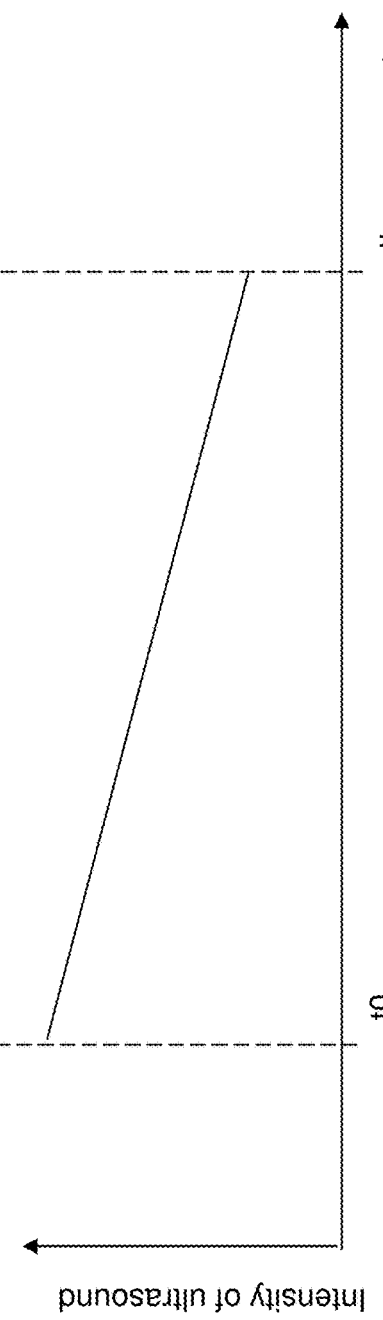

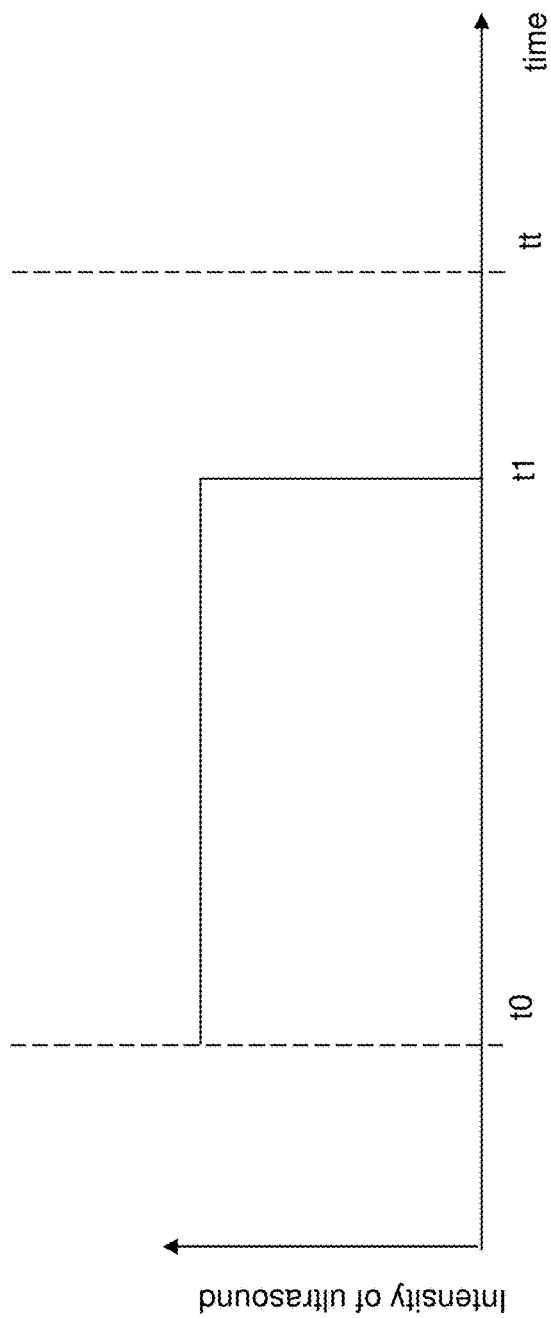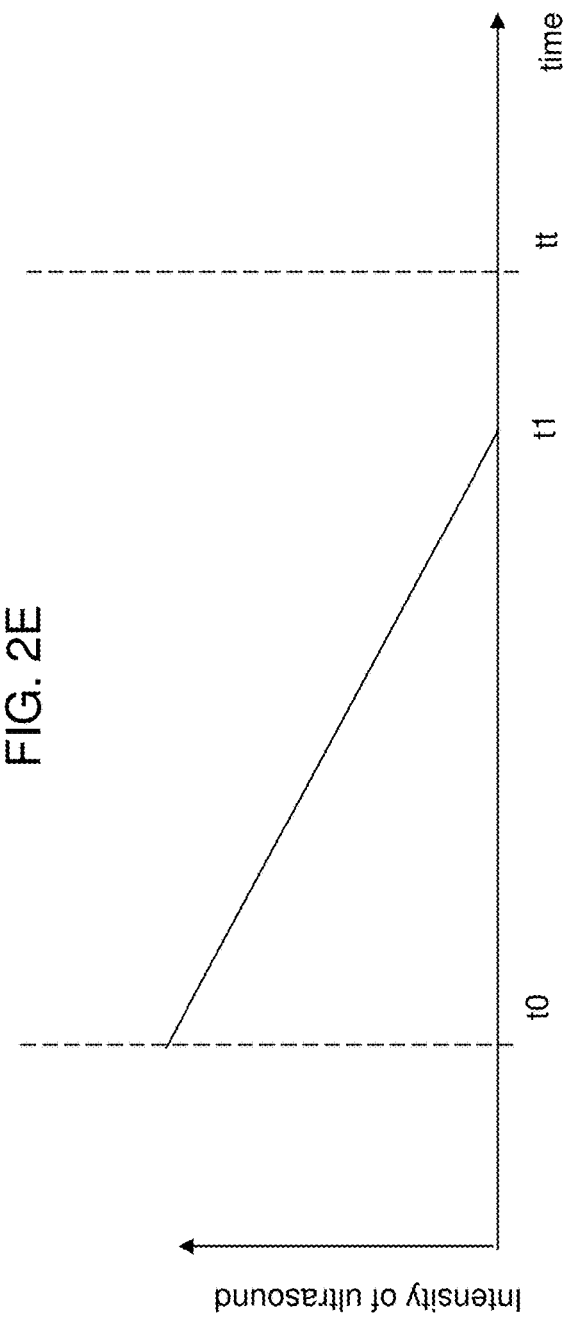

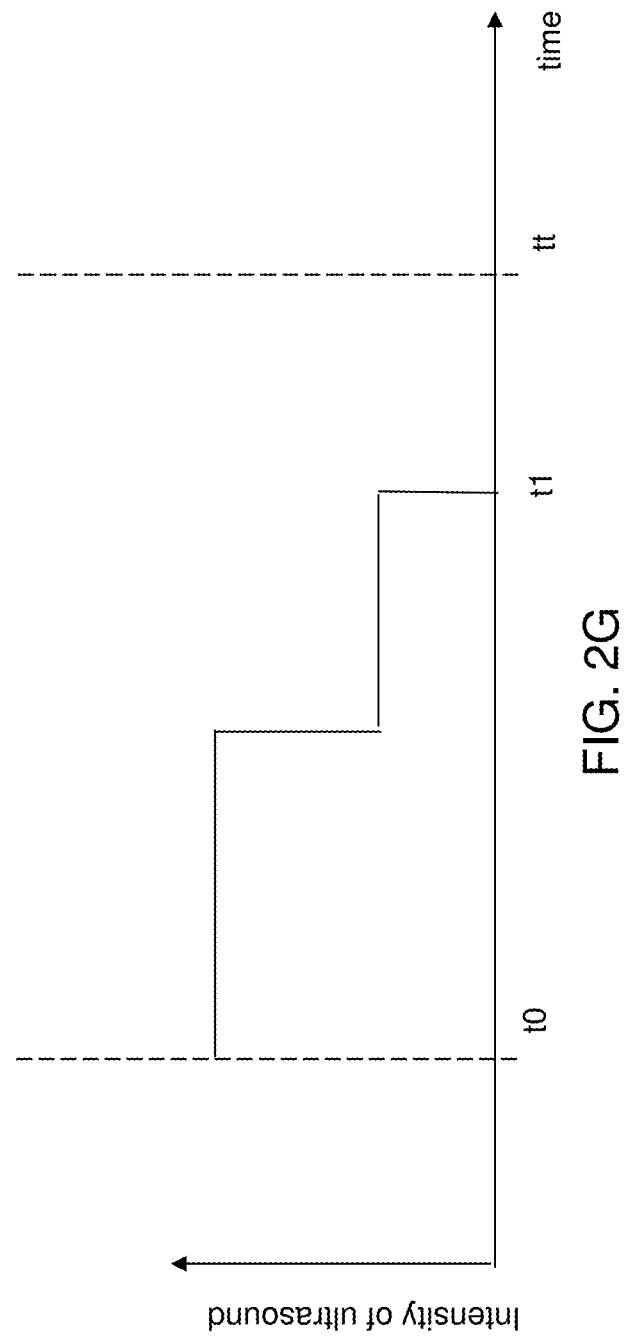

SPIN COATING PROCESS AND APPARATUS WITH ULTRASONIC VISCOSITY CONTROL

FIELD

The present disclosure relates generally to the field of semiconductor manufacturing processes and apparatuses, and particularly to a spin coating process and apparatus employing ultrasonic viscosity control during a spin coating deposition of a material, such as photoresist.

BACKGROUND

Spin coating is a depositing process that deposits a film having a relatively planar top surface on a substrate. Typically, a coating material is applied over a center region of the substrate. The substrate spun at a high rotational speed, and the coating material is spread over the entire surface of the substrate by centrifugal force as the substrate spins around a rotational axis, which is typically a vertical axis passing through the geometrical center of the substrate. A spin coater is a machine employed to perform the process of spin coating. Spin coating processes are employed in semiconductor manufacturing to apply various films on a substrate. Films that may be formed by spin coating include photoresist materials, interconnect-level dielectric material, and sacrificial polymer materials.

SUMMARY

According to an aspect of the present disclosure, a spin coating method comprises dispensing a coating material including a nonvolatile film material and a volatile solvent over a substrate; and spin coating the coating material over the substrate by spinning the substrate while applying ultrasound waves to the coating material to reduce a viscosity of the coating material during the spin coating.

According to another aspect of the present disclosure, a spin coating apparatus is provided, which comprises: a rotor chuck configured to hold a substrate thereupon; an ultrasound generator configured to generate and direct ultrasound waves toward a top surface of the rotor chuck; a fluid dispenser configured to dispense a coating material including a nonvolatile film material and a volatile solvent over the rotor chuck; and a controller configured to spin the rotor chuck while applying ultrasound waves generated from the ultrasound generator toward the substrate, wherein the coating material is selected such that viscosity of the coating material is reduced upon application of the ultrasound waves to the coating material.

BRIEF DESCRIPTION OF THE DRAWINGS

FIGS. 2A-2G are various intensity patterns for an ultrasound wave signal that may be employed for the exemplary spin coating apparatus of the present disclosure.

DETAILED DESCRIPTION

Figure 1A:
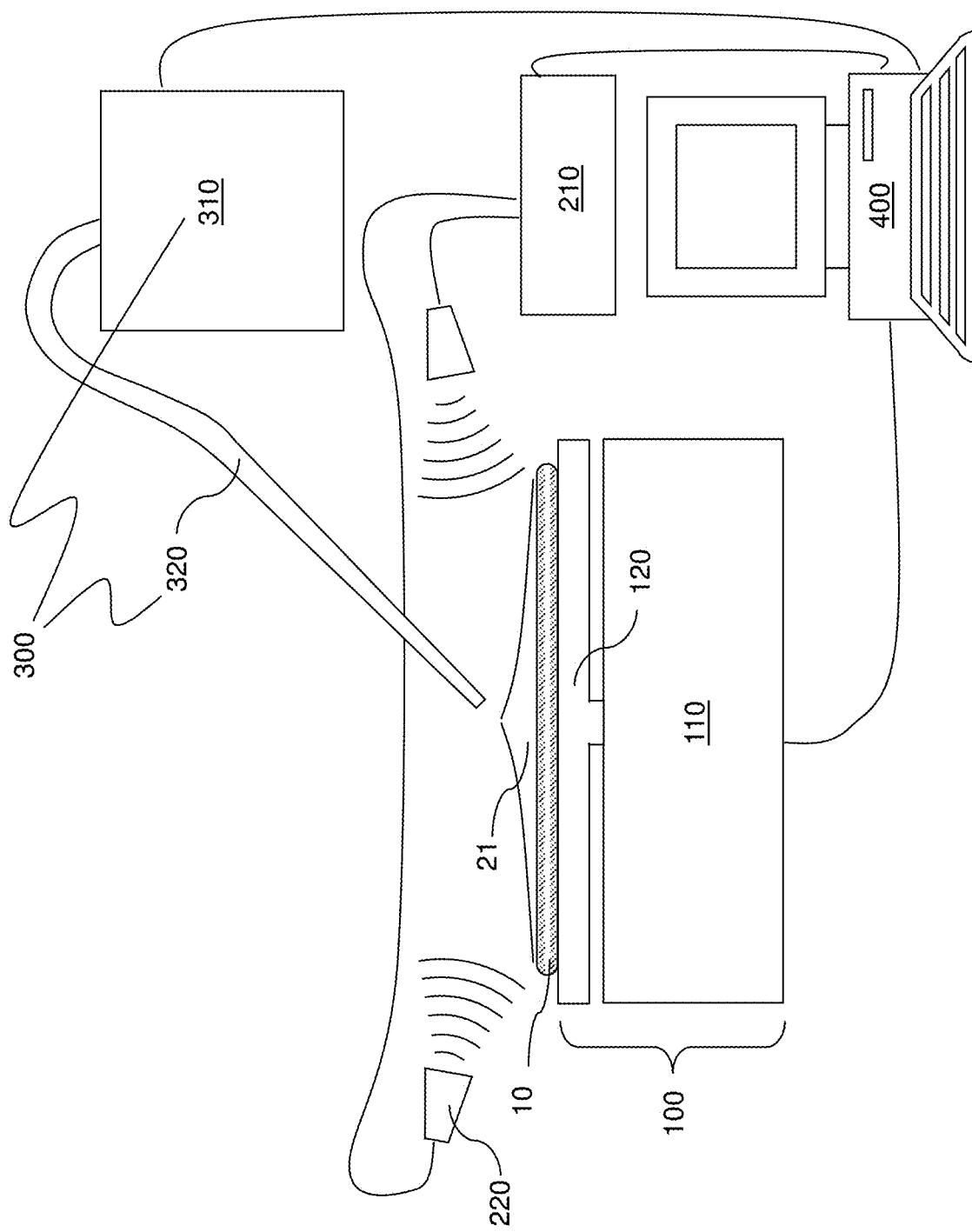
FIG. 1A is a vertical cross-sectional view of an exemplary spin coating apparatus immediately after application of a coating material according to an embodiment of the present disclosure.

A coating material deposited in a spin-coater may include a nonvolatile film material and a volatile solvent. The higher the molar percentage of the volatile solvent, the lower the viscosity of the coating material and the higher the planarity of a spun film formed by spin coating. However, the higher molar percentage of the volatile solvent induces higher film shrinkage upon volatilization of the volatile solvent and increase the cure time for the film after it is spin-coated in the substrate. Reducing the molar percentage of the volatile solvent helps reduce the film shrinkage and the cure time, but the coating material is spread over the substrate with greater topographical variations.

The embodiments of present disclosure are directed to a spin coating process and apparatus employing ultrasonic viscosity control during a spin coating deposition of a material, such as photoresist, the various aspects of which are described herebelow in detail. The ultrasonic waves reduce the viscosity of the coating material, such as photoresist material, during spin coating and thus reduce topographical variations in the spun-on film without significantly increasing the molar percentage of the volatile solvent in the coating material.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Referring to FIG. 1A, an exemplary spin coating apparatus is illustrated immediately after application of a coating material 21 according to an embodiment of the present disclosure. The exemplary spin coating apparatus comprises a chuck assembly 100 that includes a rotor chuck (i.e., a rotating substrate support) 120 and a chuck actuation unit 110 configured to rotate the rotor chuck 120 around a vertical axis passing through a geometric center of the rotor chuck 120. The rotor chuck 120 can be configured to hold a substrate, such as a semiconductor (e.g., silicon) wafer 10 thereupon. For example, the rotor chuck 120 can comprise a rigid circular plate having a planar chuck surface and containing a plurality of holes. The plurality of holes can be connected to a vacuum pump to provide vacuum suction. The substrate 10 can be affixed to the rotor chuck 120 through vacuum suction upon loading the substrate 10 on the rotor chuck 120.

The exemplary spin coating apparatus can comprise at least one ultrasound generator 220 configured to generate and direct ultrasound toward a top surface of the rotor chuck 120, and thus, toward a top surface of the substrate 10. The at least one ultrasound generator 220 may comprise a single ultrasound generator 220 or may comprise a plurality of ultrasound generators 220. Each ultrasound generator 220 may include a electropneumatic transducer that converts an electrical signal to ultrasound waves. For example, the electropneumatic transducer may be a speaker having a membrane configured to vibrate at the frequency of an electrical signal that is applied to an electromagnet that is mechanically coupled to the membrane. The ultrasound generator 220 may include a waveguide, such as a cone, that is configured to direct the ultrasound waves generated from the ultrasound generator 220 toward the top surface of the substrate 10.

The exemplary spin coating apparatus can include a signal generator 210 configured to generate an electrical signal of ultrasound frequency. In one embodiment, the frequency of the electrical signal may be in a range from 20 kHz to 20 GHz. Accordingly, the frequency of the ultrasound waves generated by the ultrasound generator 220 may be in a range from 20 kHz to 20 GHz.

The exemplary spin coating apparatus can comprise a fluid dispenser 300 configured to dispense a coating material over the rotor chuck 120. Thus, when a substrate 10 is located on top of the rotor chuck 120, the dispenser 300 is configured to dispense the coating material over the substrate 10.

The fluid dispenser 300 may comprise a coating material supply unit 310 and a nozzle 320. The coating material supply unit 310 may include a combination of a container that contains the coating material and a pump unit that is configured to pump out the coating material and impel the coating material through the nozzle 320.

The coating material can include a semi-solid slurry, such as a thixotropic slurry. For example, the coating material can include a slurry containing a nonvolatile film material and a volatile solvent in which the nonvolatile film material is dissolved. The nonvolatile film material may comprise any material that may be dissolved in the volatile solvent and subsequently form a deposited material layer upon removal of the volatile solvent. In one embodiment, the nonvolatile film material may comprise a material such as a photoresist material, a dielectric material, or polymerizable monomer units. Generally, the coating material may be any material that may be deposited by spin coating and subsequent evaporation of the volatile solvent, for example, in a subsequent curing process.

According to an aspect of the present disclosure, the coating material can be selected such that viscosity of the coating material is reduced upon application of ultrasound waves to the coating material. In one embodiment, the frequency of the ultrasound waves can be in a range from 20 kHz to 20 GHz. In one embodiment, the coating material composition, an intensity of the ultrasound waves to be generated from the ultrasound generator 220, and the frequency of the ultrasound waves can be selected such that the ultrasound waves reduce viscosity of the coating material by a percentage in a range from 1% to 99.9%.

The exemplary spin coating apparatus can comprise a controller 400 configured to control operation of the chuck assembly 100, the signal generator 210, the ultrasound generators 220, and/or the fluid dispenser 300. The controller 400 can spin the rotor chuck 120 while ultrasound waves generated from the ultrasound generator 220 are applied toward the substrate 10 located on the rotor chuck 120.

A spin coating process can be performed employing the exemplary spin coater of the present disclosure. A substrate 10 can be loaded onto the rotor chuck 120, for example, employing vacuum suction. In one embodiment, the substrate 10 may include a semiconductor substrate. The substrate 10 can include a semiconductor wafer, such as a commercially available silicon wafer. The wafer 10 may have a diameter in a range from 100 mm to 450 mm, although other types of wafers can also be employed. The substrate 10 may have a thickness in a range from 300 microns to 1 mm, although lesser and greater thicknesses may also be employed.

A coating material 21 including a nonvolatile film material and a volatile solvent can be applied over the substrate 10, for example, employing a nozzle 320. Generally, the coating material 21 can be applied to a center portion of the top surface of the substrate 10. According to an aspect of the present disclosure, the coating material 21 can be spin coated over the substrate 10 by spinning the rotor chuck 120 and the substrate 10 while reducing viscosity of the coating material 21 through application of ultrasound waves to the coating material 21. In one embodiment, the frequency of the ultrasound waves can be in a range from 20 kHz to 20 GHz. In one embodiment, the ultrasound waves reduce viscosity of the coating material 21 by a percentage in a range from 1% to 99.9%, such as from 10% to 99%, and/or from 30% to 90%.

The intensity of the ultrasound waves over the substrate 10 may be in a range from 30 dB to 110 dB, such as from 50 dB to 100 dB, although lesser and greater intensities may also be employed. The duration of the planarization step in which the substrate 10 rotates with the coating material 21 thereupon may be in a range from 10 seconds to 600 seconds, such as from 20 seconds to 120 seconds, although shorter and longer durations may also be employed.

Figure 1B:
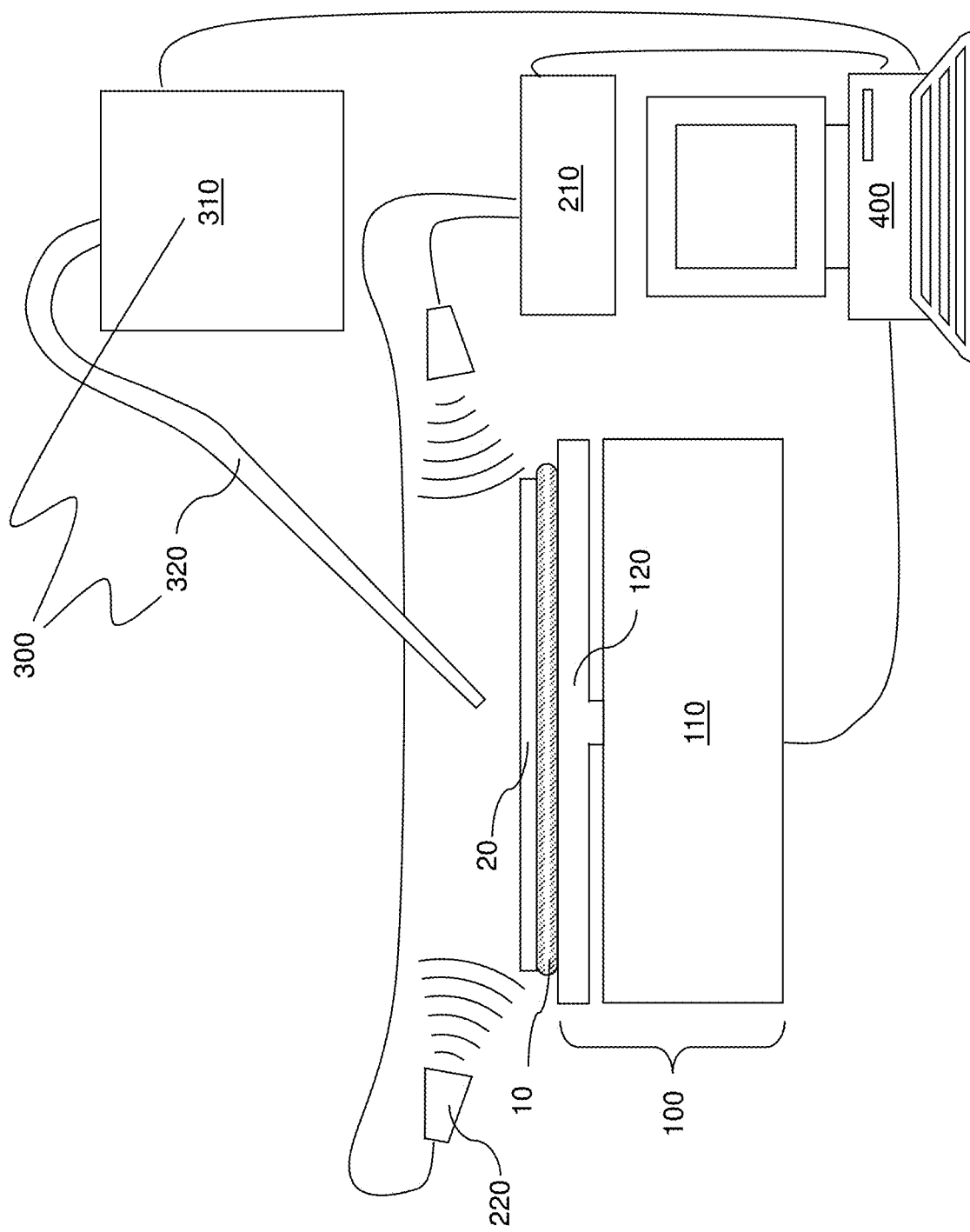
FIG. 1B is a vertical cross-sectional view of the exemplary spin coating apparatus immediately after planarizing the coating material according to an embodiment of the present disclosure.

Referring to FIG. 1B, the exemplary spin coating apparatus is illustrated immediately after planarizing the coating material into a spin-coated material layer 20. The spin-coated material layer 20 is formed by planarizing the top surface of the coating material 21 by spinning the substrate 10. The rotational speed of the substrate during the spin coating process may be in a range from 1,000 revolutions per minute to 30,000 revolutions per minute, although lesser and greater rotational speed may also be employed. The ultrasound waves are turned off after forming the spin-coated material layer 20. This causes the viscosity of the spin-coated material layer 20 to increase.

The intensity of the ultrasonic waves generated from the ultrasound generator 220 may be uniform or may be modulated during spinning of the substrate 10. FIGS. 2A-2G schematically illustrate various intensity patterns for the ultrasound wave signal that may be employed for the exemplary spin coating apparatus of the embodiments of the present disclosure during the spin coating process.

Referring collectively to FIGS. 2A-2D, the ultrasound waves may be applied to the coating material 21 throughout a planarization step in which the coating material 21 is planarized over the substrate 10. For example, the planarization step may temporally extend from an initiation time "t0" to a termination time "tt". The initiation time t0 is the point of time that is the latter of the point of time when the rotational speed of the substrate 10 is stabilized and the point of time at which the coating material 21 is applied to the substrate 10. The rotational speed of the substrate 10 is "stabilized" if the rotational speed of the substrate 10 is the same as the average rotational speed of the substrate 10 during subsequent spreading of the coating material 21. In this case, the controller 400 can be configured to apply the ultrasound waves throughout the planarization step in which the coating material 21 is planarized over the substrate 10.

Figure 2A:
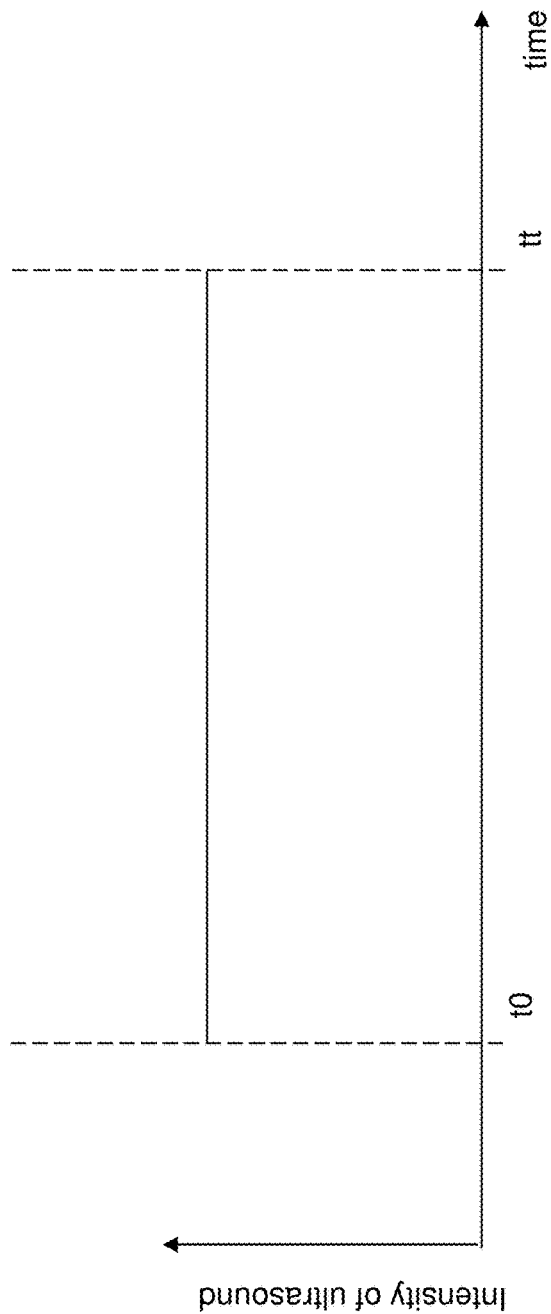

Referring to FIG. 2A, the ultrasound waves have a uniform intensity throughout the planarization step in which the coating material 21 is planarized over the substrate 10. The uniform intensity of the ultrasound waves and the frequency of the ultrasound waves can be selected such that the viscosity of the coating material 21 is reduced by a percentage in a range from 1% to 99.9%, such as from 10% to 99%, and/or from 30% to 90%. In this case, the controller 400 is configured to apply the ultrasound waves with a uniform intensity throughout the planarization step in which the coating material 21 is planarized over the substrate 10.

Figure 2B:
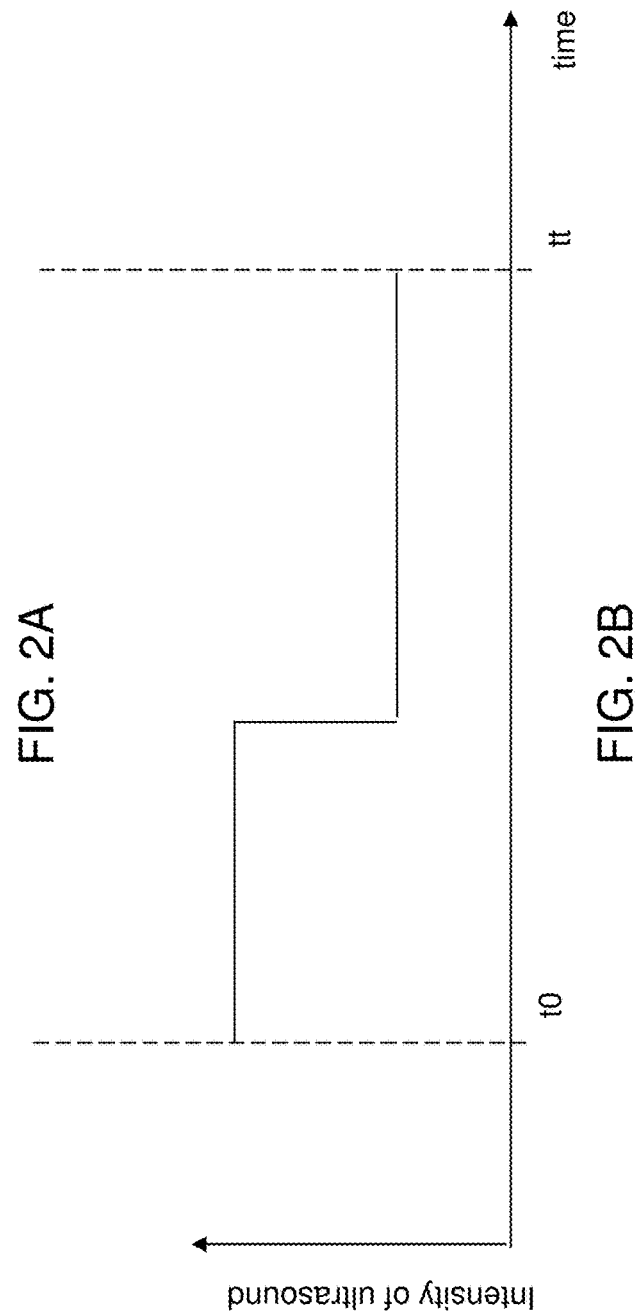

Referring to FIGS. 2B and 2C, the intensity of the ultrasound waves may decrease stepwise during the planarization step in which the coating material 21 is planarized over the substrate 10. In this case, the controller 400 is configured to apply the ultrasound waves with an intensity that decreases stepwise during the planarization step in which the coating material 21 is planarized over the substrate 10.

Referring to FIG. 2D, the intensity of the ultrasound waves may decrease continuously without a step during the planarization step in which the coating material 21 is planarized over the substrate 10. In this case, the controller 400 is configured to apply the ultrasound waves with an intensity that decreases continuously during the planarization step in which the coating material 21 is planarized over the substrate 10.

Referring collectively to FIGS. 2E-2G, the ultrasound waves may be applied to the coating material 21 during a first time period within the planarization step in which the coating material is planarized over the substrate 10, and the ultrasound waves are not applied to the coating material 21 in a second time period that follows the first time period. For example, the first time period may start at the initiation time t0, and may end at an ultrasound termination time t1, and the second time period may start at the ultrasound termination time t1 and may end at the termination time tt. The second time period can be a portion of the planarization step. In this case, the controller 400 is configured to apply the ultrasound waves during the first time period within the planarization step in which the coating material 21 is planarized over the substrate 10, and not to apply the ultrasound waves to the coating material 21 in a second time period that follows the first time period.

Referring to FIG. 2E, the ultrasound waves may have a uniform intensity throughout the first time period, i.e., between the initiation time t0 and the ultrasound termination time t1.

Referring to FIGS. 2F and 2G, the intensity of the ultrasound waves may decrease stepwise or continuously during the first time period. In this case, the controller 400 is configured to apply the ultrasound waves with an intensity that decreases stepwise or continuously during the first time period.

If the spin-coated material layer 20 comprises a photoresist layer, then it is cured after spin coating to remove (i.e., volatilize) the volatile solvent. The photoresist layer can then be exposed and patterned by a photolithographic process. The patterned photoresist can be used as mask during fabrication of a semiconductor device on the substrate 10. For example, the patterned photoresist can be used as an etch mask to etch one or more underlying layers of the semiconductor device which underlie the patterned photoresist. The semiconductor device may comprise a three-dimensional memory device, such as a three-dimensional NAND memory device which has large vertical steps. The increased planarity of the patterned photoresist improves the photolithography and etching process precision, and enables the use of a single photoresist spin-coating step using one type of chemical slurry composition.

Figure 3:
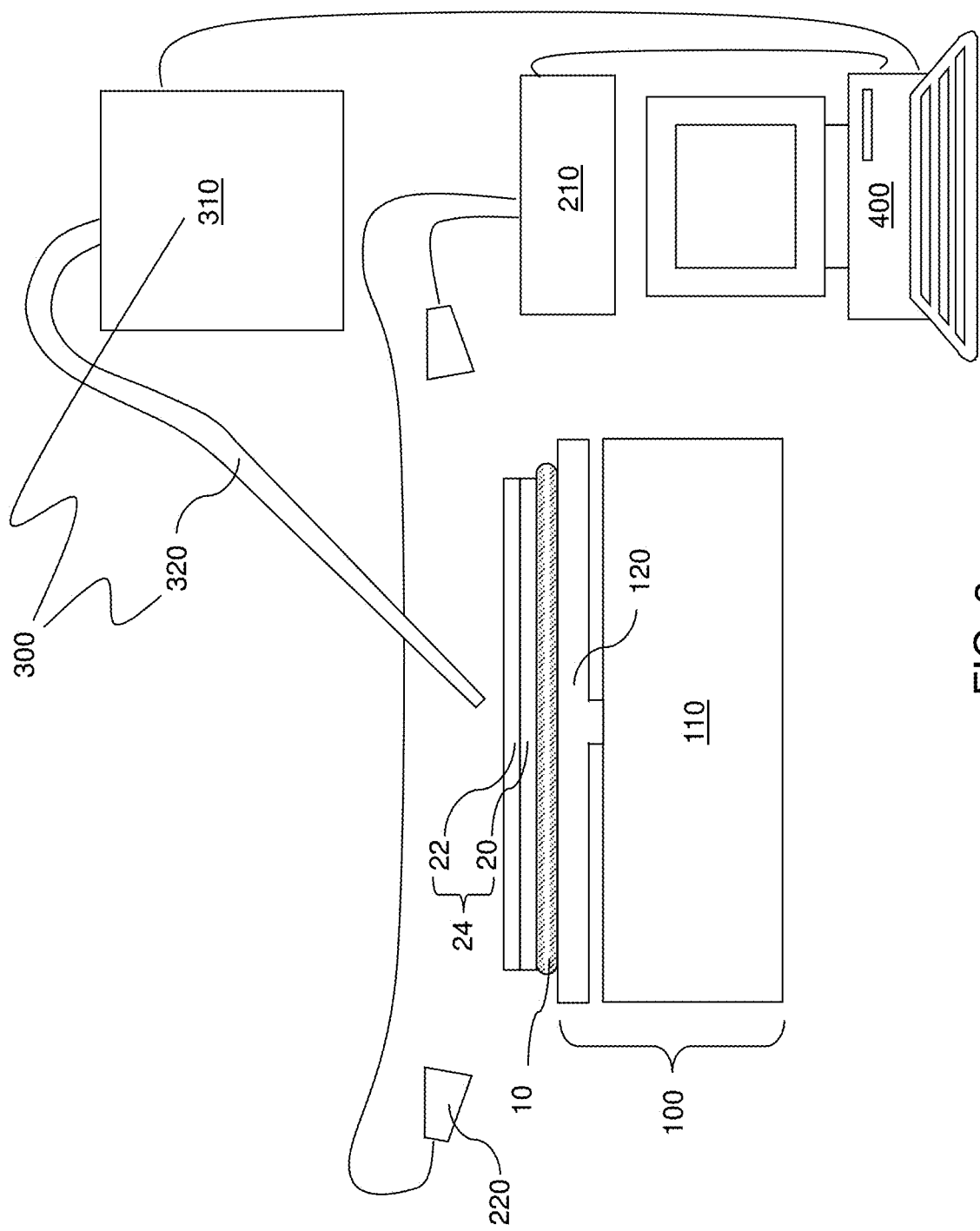
FIG. 3 is a vertical cross-sectional view of the exemplary spin coating apparatus after application and planarization of a second coating material according to an embodiment of the present disclosure.

Referring to FIG. 3, the exemplary spin coating apparatus is illustrated after application and planarization of a second coating material over the spin-coated material layer 20 according to an embodiment of the present disclosure. The spin-coated material layer 20 in FIG. 3 can be the same as the spin-coated material layer 20 of FIG. 1B. The spin-coated material layer 20 is herein referred to as a first spin-coated material layer 20.

An additional coating material can be applied over the first spin-coated material layer 20 (which is a layer of the coating material 21 as applied over the substrate 10 at the processing steps of FIG. 1A) after the ultrasound waves are turned off, i.e., after formation of the spin-coated material layer 20. In one embodiment, the additional coating material can be spin coated over the layer of the coating material (i.e., over the first spin-coated material layer 20) without applying ultrasound waves to the additional coating material. In an alternative embodiment, the additional coating material can be spin coated over the layer of the coating material (i.e., over the first spin-coated material layer 20) while applying ultrasound waves to the additional coating material. The additional coating material may form a second spin-coated material layer 22. Generally, a layer stack 24 of the first spin-coated material layer 20 and the second spin-coated material layer 22 can be formed. The layer stack 24 can include two or more spin-coated material layers (20, 22). In an illustrative example, the first spin-coated material layer 20 may include a bottom anti-reflective coating (BARC) layer (which can be a polymer layer), and the second spin-coated material layer 22 may include a photoresist material layer. Alternatively, the first spin-coated material layer 20 may include a photoresist material layer (e.g., positive or negative photoresist), and the second spin-coated material layer 22 may include a top anti-reflective coating (TARC) layer (which can be a polymer layer). Optionally, a third spin-coated material layer (not shown) can be formed over the second spin-coated material layer 22.

Figure 4A:
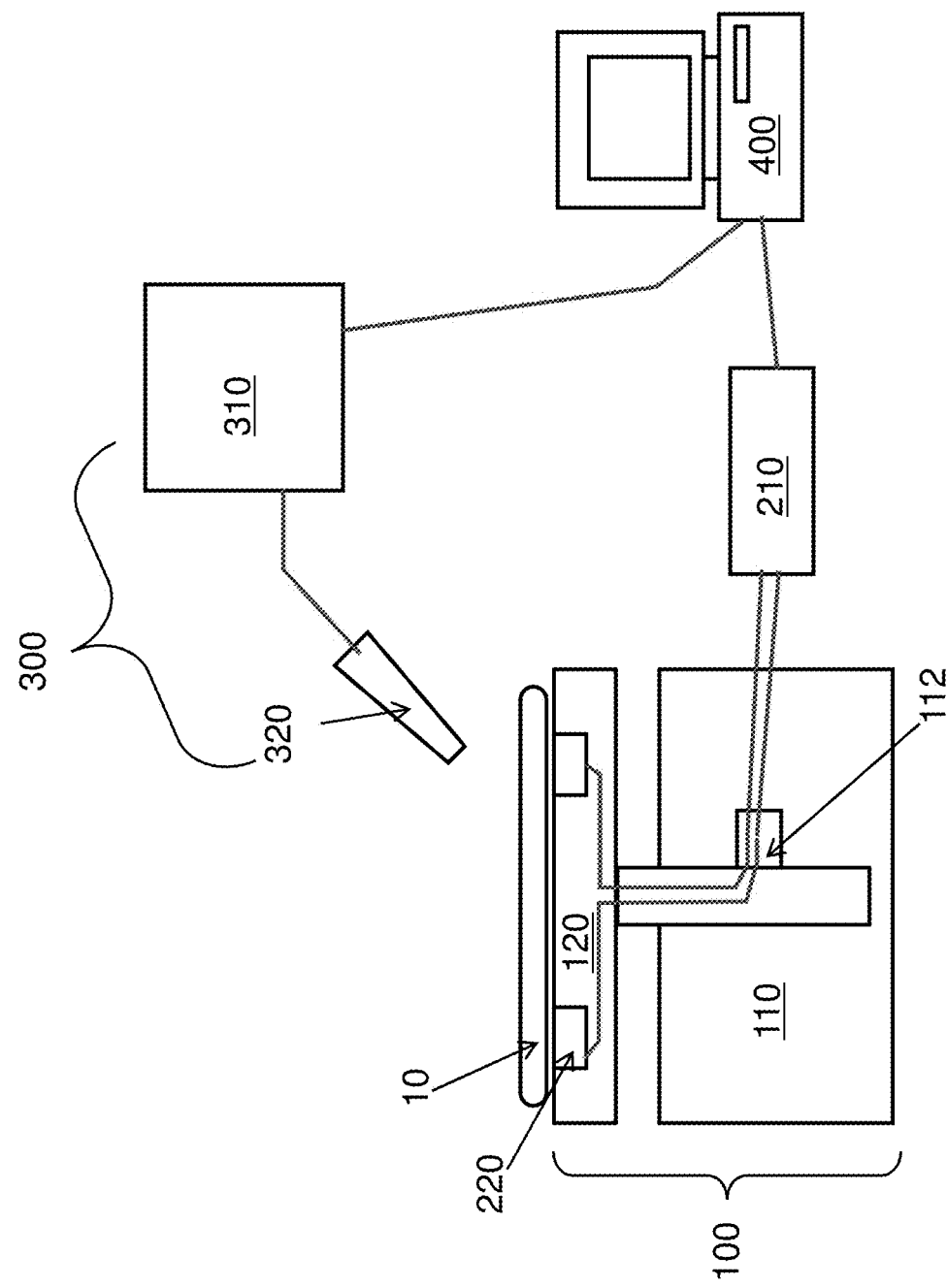
FIG. 4A is a vertical cross-sectional view of a spin coating apparatus according to an alternative embodiment of the present disclosure.
Figure 4B:
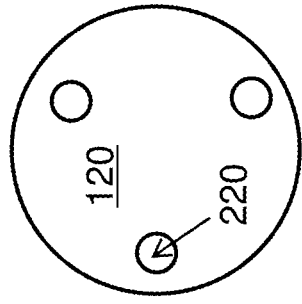
FIGS. 4B, 4C, 4D, 4E and 4F are top see-through views of alternative configurations of the rotor chuck of the apparatus of FIG. 4A.
Figure 4C:
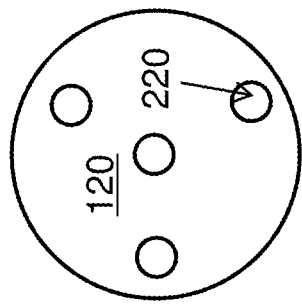
Figure 4D:
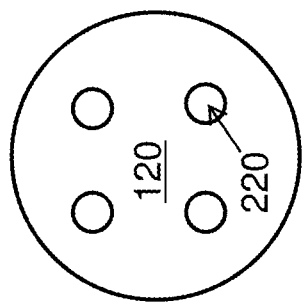
Figure 4E:
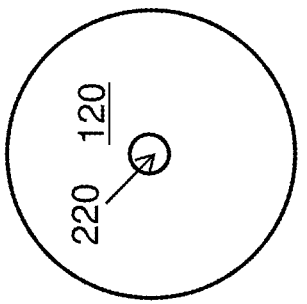
Figure 4F:
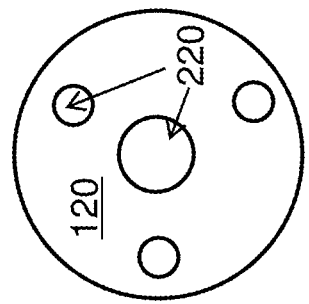

FIG. 4A illustrates a spin coating apparatus according to an alternative embodiment. In this embodiment the at least one ultrasound generator 220 is configured to generate and direct ultrasound toward a bottom surface of the substrate 10. The at least one ultrasound generator is mounted inside the rotor chuck 120 and the vibration of the ultrasonic waves is directly transmitted to the substrate 10. The signal generator 210 is electrically connected to and controls the ultrasound generator 220 via a slip ring 112. This alternative configuration is useful for coating the substrate 10 in a vacuum.

The ultrasound generator 220 does not have to be the same size as the rotor chuck 120. As shown in FIGS. 4B to 4F, one ultrasound generator 220 or plural ultrasound generators 220 can be mounted inside the rotor chuck 120 at various exemplary locations. In another embodiment, one or more ultrasound generators 220 can be mounted inside the rotor chuck 120 as shown in FIG. 4A, while one or more additional ultrasound generators 220 can be mounted above the rotor chuck 120 as shown in FIG. 1A.

Generally, a layer stack 24 including multiple material layers may be formed by performing multiple spin coating processes. At least one spin coating process may employ ultrasonic waves that alter the viscosity of a respective coating material. A change in the viscosity of the coating material changes the flow properties in the combination of the nonvolatile film material and the volatile solvent. Topographical variations in the top surface of the spin-coated material layer (20 or 22) can be reduced through use of the ultrasonic waves during the planarization step of the spin coating process. Further, the molar percentage of the volatile solvent in the coating material can be reduced in the spin coating process through use of the ultrasonic waves during the planarization process. Reduction of the molar percentage of the volatile solvent can reduce the duration of a curing step that follows the planarization step. The various embodiments of the present disclosure can be employed to increase the planarity of a spin-coated material layer during a planarization step, and to reduce the duration and/or an anneal temperature during a subsequent cure step.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A spin coating method, comprising:
dispensing a coating material including a nonvolatile film material and a volatile solvent over a substrate;
spin coating the coating material over the substrate by spinning the substrate while applying ultrasound waves to the coating material to reduce a viscosity of the coating material during the spin coating;
applying an additional coating material over a layer of the coating material on the substrate after the ultrasound waves are turned off; and
spin coating the additional coating material over the layer of the coating material without applying ultrasound waves to the additional coating material.

2. The spin coating method of claim 1, wherein the ultrasound waves are applied to the coating material throughout a planarization step in which the coating material is planarized over the substrate.

3. The spin coating method of claim 2, wherein the ultrasound waves have a uniform intensity throughout the planarization step in which the coating material is planarized over the substrate.

4. The spin coating method of claim 2, wherein an intensity of the ultrasound waves decreases stepwise during the planarization step in which the coating material is planarized over the substrate.

5. The spin coating method of claim 2, wherein an intensity of the ultrasound waves decreases continuously without a step during the planarization step in which the coating material is planarized over the substrate.

6. The spin coating method of claim 1, wherein the ultrasound waves are applied to the coating material during a first time period within the planarization step in which the coating material is planarized over the substrate, and the ultrasound waves are not applied to the coating material in a second time period that follows the first time period, the second time period being a portion of the planarization step.

7. The spin coating method of claim 6, wherein the ultrasound waves have a uniform intensity throughout the first time period.

8. The spin coating method of claim 6, wherein an intensity of the ultrasound waves decreases stepwise or continuously during the first time period.

9. The spin coating method of claim 1, wherein the frequency of the ultrasound waves is in a range from 20 kHz to 20 GHz.

10. The spin coating method of claim 1, wherein the ultrasound waves reduce the viscosity of the coating material by a percentage in a range from 1% to 99.9%.

11. The spin coating method of claim 1, wherein the substrate comprises a semiconductor substrate.

12. The spin coating method of claim 1, wherein the nonvolatile film material comprises a material selected from a photoresist material, a dielectric material, and a polymerizable monomer units.

13. The spin coating method of claim 12, wherein the nonvolatile film material comprises the photoresist material.

* * * * *